(12) United States Patent
Chen et al.

(10) Patent No.: US 8,890,227 B1
(45) Date of Patent: Nov. 18, 2014

(54) MEMORY CELL

(71) Applicant: AP Memory Corporation, USA, Beaverton, OR (US)

(72) Inventors: Wenliang Chen, Vancouver, WA (US); Lin Ma, Beaverton, OR (US)

(73) Assignee: AP Memory Corp, USA, Beaverton, OR (US)

( * ) Notice: Subject to any disclaimer, the term of this patent is extended or adjusted under 35 U.S.C. 154(b) by 0 days.

(21) Appl. No.: 13/871,946

(22) Filed: Apr. 26, 2013

(51) Int. Cl.
*H01L 27/108* (2006.01)

(52) U.S. Cl.
CPC .... *H01L 27/10808* (2013.01); *H01L 27/10855* (2013.01)
USPC ............ 257/306; 257/309; 438/253; 365/149

(58) Field of Classification Search
CPC .............. H01L 27/108; H01L 27/0629; H01L 2924/1436; H01L 27/10855
USPC .................... 257/306, 309; 438/253; 365/149
See application file for complete search history.

(56) References Cited

U.S. PATENT DOCUMENTS

| | | | |
|---|---|---|---|
| 5,650,351 A * | 7/1997 | Wu ............................... | 438/398 |
| 6,285,613 B1 * | 9/2001 | Koya ............................ | 365/205 |
| 7,310,256 B2 * | 12/2007 | Takemura et al. .............. | 365/63 |
| 2005/0265068 A1 * | 12/2005 | Takemura et al. ............ | 365/149 |

* cited by examiner

*Primary Examiner* — Tu-Tu Ho
(74) *Attorney, Agent, or Firm* — Berkeley Law & Technology Group, LLP

(57) ABSTRACT

Implementations disclosed herein may relate to a memory cell, such as a DRAM memory cell, for example.

13 Claims, 4 Drawing Sheets

MEMORY CELL

BACKGROUND

1. Field

Subject matter disclosed herein relates to memory technology, such as dynamic random access memory (DRAM).

2. Information

Integrated circuit devices, which may include memory devices, for example, may be found in a wide range of electronic devices. For example, memory devices may be used in computers, digital cameras, cellular telephones, portable entertainment devices, and so forth. Use of a memory technology for a particular product or application includes a variety of considerations, such as, physical size of a particular device, storage density, operating voltages, device stability over time, read/write speed, and/or power consumption, for example. Other example factors that may be of interest may also include cost of manufacture, ease of manufacture, and/or reliability.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, claimed subject matter may best be understood by reference to the following detailed description if read with the accompanying drawings in which:

Figure 1:
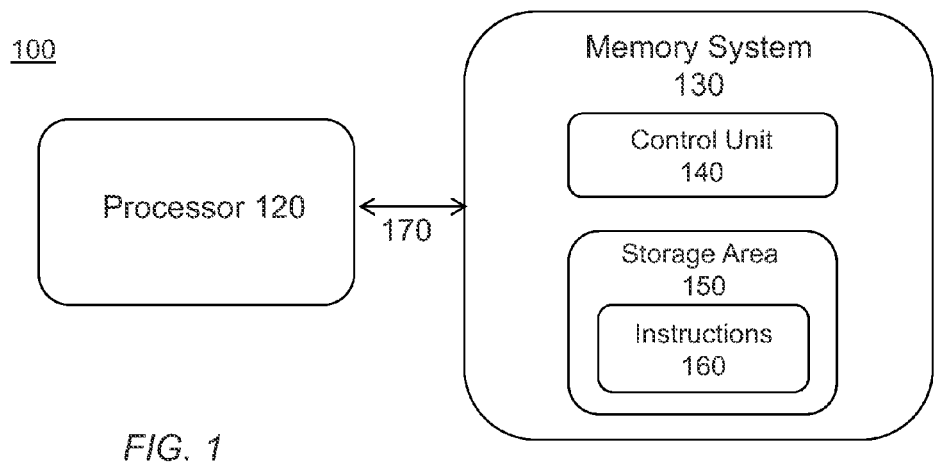
FIG. 1 is a schematic diagram depicting an example computing platform including a memory cell according to an embodiment.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other implementations may be utilized. Furthermore, structural and/or other changes may be made without departing from claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

In the following detailed description, numerous specific details are set forth to provide a thorough understanding of claimed subject matter. For purposes of explanation, specific numbers, systems and/or configurations are set forth, for example. However, it should be apparent to one skilled in the relevant art having benefit of this disclosure that claimed subject matter may be practiced without specific details. In other instances, well-known features may be omitted and/or simplified so as not to obscure claimed subject matter. While certain features have been illustrated and/or described herein, many modifications, substitutions, changes and/or equivalents may occur to those skilled in the art. It is, therefore, to be understood that appended claims are intended to cover any and all modifications and/or changes as fall within claimed subject matter.

Reference throughout this specification to one implementation, an implementation, one embodiment, an embodiment and/or the like may mean that a particular feature, structure, or characteristic described in connection with a particular implementation or embodiment may be included in at least one implementation or embodiment of claimed subject matter. Thus, appearances of such phrases, for example, in various places throughout this specification are not necessarily intended to refer to the same implementation or to any one particular implementation described. Furthermore, it is to be understood that particular features, structures, or characteristics described may be combined in various ways in one or more implementations. In general, of course, these and other issues may vary with context. Therefore, particular context of description or usage may provide helpful guidance regarding inferences to be drawn.

Operations and/or processing, such as in association with networks, such as computer and/or communication networks, for example, may involve physical manipulations of physical quantities. Typically, although not necessarily, these quantities may take the form of electrical and/or magnetic signals capable of, for example, being stored, transferred, combined, processed, compared and/or otherwise manipulated. It has proven convenient, at times, principally for reasons of common usage, to refer to these signals as bits, data, values, elements, symbols, characters, terms, numbers, numerals, and/or the like. It should be understood, however, that all of these or similar terms are to be associated with appropriate physical quantities and are intended to merely be convenient labels.

Likewise, in this context, the terms "coupled", "connected," and/or similar terms, may be used. It should be understood that these terms are not intended as synonyms. Rather, "connected" may be used to indicate that two or more elements or other components, for example, are in direct physical and/or electrical contact; while, "coupled" may mean that two or more components are in direct physical or electrical contact; however, "coupled" may also mean that two or more components are not in direct contact, but may nonetheless co-operate or interact. The term "coupled" may also be understood to mean indirectly connected, for example, in an appropriate context.

The terms, "and", "or", "and/or" and/or similar terms, as used herein, may include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms may be used to describe any feature, structure, and/or characteristic in the singular and/or may be used to describe a plurality or some other combination of features, structures and/or characteristics. Though, it should be noted that this is merely an illustrative example and claimed subject matter is not limited to this example. Again, particular context of description or usage may provide helpful guidance regarding inferences to be drawn.

It should be understood that for ease of description a computer may be embodied and/or described in terms of a computing device. However, it should further be understood that this description should in no way be construed that claimed subject matter is limited to one embodiment and instead, may be embodied as a variety of devices or combinations thereof, including, for example, one or more illustrative examples, as described later. In this context, the term computing device refers to any device capable of performing computations; such as, a desktop computer, a laptop computer, a tablet, a set top box, etc.; however, typically, a computing device may also be capable of sending and/or receiving signals (e.g., signal packets), such as via a wired or wireless network, may be capable of performing arithmetic and/or logic operations, processing and/or storing signals, such as in memory as physical memory states, and/or may, for example, operate as a client and/or as a server. The Internet refers to a decentralized global network of interoperable networks, including devices that are part of those interoperable networks. The Internet includes local area networks (LANs), wide area networks (WANs), wireless networks, and/or long haul public networks that, for example, may allow signal packets to be communicated between LANs. Signal packets, also referred to as signal packet transmissions, may be communicated between nodes of a network, including a computer network, where a node may comprise one or more devices, such as computing devices, for example.

A protocol refers to a set of signaling conventions for communications between or among devices, such as in a network, typically computing devices, as previously discussed; for example, devices that substantially comply with a protocol and/or that are substantially compatible with a protocol. In this context, the term "between" and/or similar terms are understood to include "among" if appropriate for the particular usage. Likewise, in this context, the terms "compatible with", "comply with" and/or similar terms are understood to include substantial compliance or substantial compatibility. At times, a protocol may have several layers. These layers may be referred to here as a communication stack. Various types of communications may occur across various layers. For example, as one moves higher in a communication stack, additional functions may be available by transmitting communications that are compatible and/or compliant with a particular protocol at these higher layers.

As previously mentioned, conventionally, a memory may be employed in a variety of situations, such as in a cell phone, a tablet, a laptop, a display, a desktop, a high definition television, etc. In general, as devices, such as a display as simply one example, become more complex, such as one that may be used with a computer or similar device, such as a consumer electronics product, use of larger memories has become more desirable; however, due at least in part to semiconductor manufacturing technologies at 90 nm, SRAM, such as six transistor SRAM for a memory cell, may result in a memory of an undesirable size as the amount of memory cells increases. One approach may be to employ SRAM at 40-50 nm, However, use of state of the art SRAM manufacturing technologies at 40-50 nm, for example, may result in additional expense, which is also a disadvantage. Thus, an approach that, for example, is able to employ DRAM using 90 nm semiconductor manufacturing technology while keeping the size of a memory cell contained, may be desirable. Of course, claimed subject matter is not limited in scope in this respect. Thus, such an approach may nonetheless potentially also be used with semiconductor manufacturing technology of smaller line widths.

For purposes of this context, in an embodiment of a memory cell, for example, if a particular physical signal and/or state, such as a voltage, current, impedance, resistance, or other measurable quantity, such as an electrical and/or magnetic property, for example, represents a first logic value, a "complementary" signal state may comprise a signal and/or state that represents a differing logic value, such as for binary digital signals and/or states, for example. In one possible example just to illustrate, if an approximately 1.2 voltage signal level (VSL) represents a logic 1, a complementary voltage signal level, such as a voltage signal level that approximates 0.0, may represent a logic 0. Thus, here complementary, unless the context clearly suggests otherwise, refers to a logical complement. Thus, it should be noted that in some embodiments, logic values may be invoked in accordance with varying relationship(s) between a signal (and/or a state) and its complement. Claimed subject matter, therefore, is not limited in this respect. For example, a signal or state at an approximately 1.2 VSL may in some embodiments represent a logic 1, and a signal or state of an approximately −1.2 VSL may represent a logic 0, so that an approximately −1.2 VSL represents a logical complement of an approximately 1.2 VSL, but, in this example, a logical complement also happens to be a complement in terms of physical quantity as well. Accordingly, claimed subject matter is intended to embrace all approaches or instances of representing a logical complement of a signal or state.

Embodiments of claimed subject matter may be employed for use with various memory technologies, such as dynamic random access memory (DRAM), for example. In a DRAM memory cell, a logic 1 or a logic 0 state, for example, may be present in a cell of a memory storage array by storing charge, such as via a connection to a component capable of storing charge, such as, for example, a storage capacitor. In an embodiment, a storage capacitor may, for example, comprise polysilicon electrically conductive material, such as plates, for example, separated by an insulating material. Thus, in an embodiment, at a storage node associated with a memory cell, for example, such as via a connection to a memory cell, charge that may be transferred to a plate of the storage capacitor via the connection may generate an electromagnetic field. It is noted, however, that this is merely one example embodiment and claimed subject matter is not limited to illustrative examples necessarily. For example, any component capable of having a sufficient amount of electrical capacitance may operate as a storage capacitor.

In an embodiment, DRAM memory may be arranged into an array that may be etched into a wafer comprising a semiconductor material, such as silicon, for example, but may be formed using other materials and/or processes and claimed subject matter is not limited in this regard. In an embodiment, a logic value (e.g., a signal and/or state), such as 0 or 1, for example, may be stored in a DRAM cell by selecting a particular row or "wordline" and selecting a particular column or "bitline." It is, of course, understood that designations, such as row, column, wordline and/or bitline, etc., may change and/or be interchanged and still remain within claimed subject matter. Thus, presently employed designations are primarily for convenience of discussion, but are not intended to limit scope of claimed subject matter. In an embodiment, if a particular wordline and a particular bitline are selected, typically via a change in voltage signal level and/or current signal level for the particular lines, a transistor switching device, such as a metal oxide semiconductor (MOS) device, for example, associated with the memory cell, may be switched to an alternate state, such as from an "off" state to an "on"

state, for example, which may allow charge to flow, for example, to a storage capacitor, discussed in more detail below.

In one non-limiting example, to store a logic 1, charge may be transferred in a direction to (e.g., into) a storage capacitor. To store logic 0, charge may be transferred in a reverse direction, such as from (e.g., out of) a storage capacitor to a local ground, such as via a connection to a memory cell. It is noted, of course, that designation, such as direction of current, sign of voltage, current signal level and/or voltage signal level, etc., as logic 1 or 0, may change and/or be interchanged and still remain within claimed subject matter. Thus, presently employed designations are primarily for convenience of discussion but are not intended to limit scope of claimed subject matter. In an embodiment, DRAM memory cells may be organized into memory arrays of any size, and may comprise any number of memory cells, which may number into the billions, trillions, almost without limitation, if desired.

In forming a DRAM array, a consideration may involve charge storage capacity of, for example, one or more capacitors providing storage nodes to be connected to one or more memory cells of an array. In an embodiment, typically more charge storage capacity may consume a greater percentage of an available horizontal surface area of a semiconductor wafer, if a planar storage capacitor, for example, is employed. As previously alluded to, a storage capacitor, for example, may comprise planar electrically conductive plates separated by a dielectric (e.g., insulating) layer to provide at least partial electrical isolation between the plates, although, of course, this is merely an example.

Nonetheless, to continue with an example, to maintain a sufficient voltage signal level, a memory system may occasionally electrically refresh a memory array, including storage capacitors, to compensate at least partially for leakage current that may give rise to a measurable change in voltage signal level. It is noted that surface area of electrically conductive plates, for example, is related to available capacitance. Thus, the greater the surface area of the electrically conductive structure, whether or not a plate, the more electrical storage capability. Thus, if relatively small surface areas for one or more planar capacitors are employed to provide sufficient room on a die for memory cells, more frequent refreshing may be desirable to compensate at least partially for leakage current. Thus, in general, it may be desirable to attempt in a given structure to balance memory cell packing density with refresh capability of a memory system. It should be noted, of course, that a variety of additional considerations may be applicable, and claimed subject matter is, therefore, not limited in scope to this particular consideration alone.

In at least some embodiments, if possible, it may be advantageous to have DRAM memory arrays capable of operating at relatively low voltage signal levels. There may be a variety of advantages from doing so and claimed subject matter is not limited in scope to particular advantages; however, one possible advantage may include reduced power consumption. As another example of a possible advantage, lower voltage operation, for example, may permit satisfactory operation using smaller dimensions. For example, using lower voltage signal levels, thinner insulating layers may also be employed to switch a transistor from 'off' to 'on.' A lower voltage signal level, as an example, may suggest less physical separation between an active region of a transistor a given voltage signal level to switch a transistor 'on.' In contrast, if a memory cell is designed to operate using a relatively higher voltage signal between a transistor gate and a transistor active region (e.g., for example, an underlying N-type semiconductor material), a depth or thickness of an oxide or other dielectric layer providing at least partial electrical isolation between a transistor gate and an underlying N-type semiconductor material may be greater.

In one possible example, to illustrate, an oxide or other dielectric layer may be suitable for use with a transistor gate so that a VSL of approximately 3.0 volts relative to an underlying N-type semiconductor material may provide a sufficient voltage signal level to activate a transistor; however, the layer may provide too much thickness relatively speaking to activate a transistor of the same or a similar semiconductor material using a VSL of approximately 1.2 volts. In addition to relatively thin dielectric layers, state of the art CMOS logic fabrication processes for line widths corresponding to 90 nm, for example, are compatible with use of a VSL of approximately 1.2 volts, for example. However, state of the art CMOS logic fabrication processes for line widths corresponding to 90 nm, for example, are not compatible with use of a VSL of approximately 3.0 volts, for example. Thus, to accommodate or be compatible with use of a VSL of approximately 3.0 volts, using corresponding CMOS logic fabrication processing may suggest introducing additional manufacturing process operations, which may be undesirable, since to do so may increase complexity, increase cost and/or introduce manufacturing delay, etc.

On the other hand, while use of a VSL of approximately 1.2 volts may not result in additional processing operations, use of relatively low voltage DRAM memory circuitry, such as use of a VSL of approximately 1.2 volts, may give rise to various other concerns. For example, in single-transistor DRAM memory cells, such as described in U.S. Pat. No. 8,361,863, titled "Embedded DRAM With Multiple Gate Oxide Thickness," if an N-type metal oxide semiconductor (NMOS) transistor is employed, it may be problematic to present a sufficient voltage signal level to a storage node in association with a storage operation for satisfactory performance. For example, in the event that a transistor gate is selected, and a VSL of approximately 1.2 volts, for example, is present as an input voltage signal, a voltage difference or voltage drop, such as for an NMOS transistor, across the transistor (e.g., source-to drain or drain-to-source) may be reduce a VSL at a storage node by, for example, approximately equal to the threshold voltage of the NMOS transistor, in the range of from approximately 0.5 to approximately 0.7 volts from an input voltage signal level of approximately 1.2 volts, in this example. Accordingly, during a read operation, it may be problematic for sense amplifiers, for example, to detect a logic state associated with a storage node due at least in part to a relatively low voltage signal level. Further, maintaining a relatively low voltage signal level may indicate more frequent refreshing, which may be overly burdensome to associated memory circuitry and/or a memory controller, for example, in some situations.

In another example, if a single-transistor DRAM memory cell implemented using a P-type metal oxide semiconductor (PMOS) transistor were employed, it may be problematic to present a VSL of approximately 0.0 volts, for example. In one instance, in the event that a transistor is selected, and an input voltage signal level of 0.0 volts is provided, a voltage drop or difference across the transistor may reduce the input voltage signal level from a VSL of approximately 0.0 volts to a VSL of approximately equal to the threshold voltage of the PMOS transistor, in the range of from approximately minus 0.5 to approximately minus 0.7, again, in this example. Thus, it can be seen that for at least several reasons, it may be undesirable to implement a single-transistor DRAM memory cell, particularly if using relatively low voltage signal levels, such as approximately 1.2, as an example. Typically, therefore, for relatively low VSLs, and/or to result in a smaller size memory cell, an SRAM cell, such as a six-transistor memory cell, may be fabricated using technologies that employ relatively small line widths, such as 40-50 nm, for example.

However, nonetheless, operation of DRAM cells at reduced voltage signal levels may be advantageous for a variety of reasons, including, for example, those previously discussed. Thus, in one or more embodiments, at least some of which may be described further herein, a DRAM memory cell may be implemented using a combination of NMOS and PMOS transistors, for example. As indicated, use of a DRAM memory cell at a relatively low voltage signal level, such as a magnitude of approximately 1.2 volts, for example, may permit thinner insulation layers providing at least partial electrical isolation, such as dielectric layers, including, for example, an oxide layer, as previously discussed, to separate a transistor gate from an underlying P-type or N-type semiconductor material. Further, use of a combination of an NMOS and a PMOS transistor switch may provide lower-cost, higher density memory devices that may be fabricated using CMOS logic manufacturing processes, which may be simpler and/or less costly than those that may be used, for example, to fabricate a six-transistor static random access (SRAM) cell memory array of equivalent density, for example.

Figure 5:
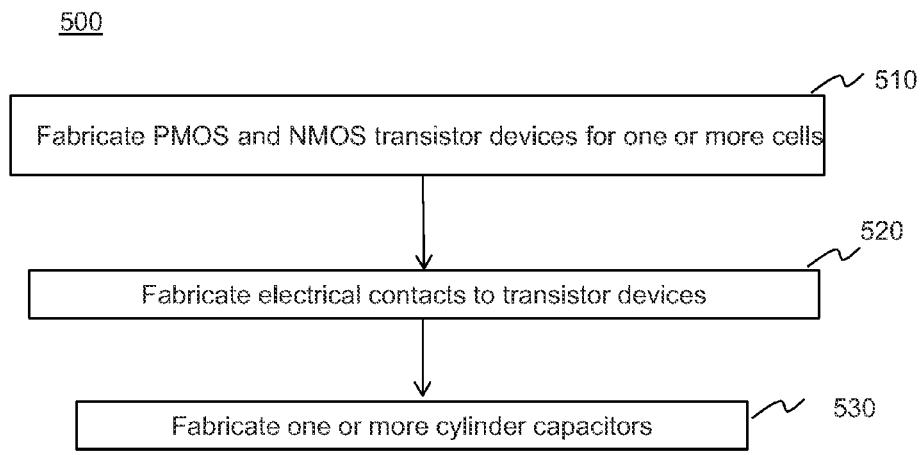
FIG. 5 is a flowchart for a method of fabricating a memory cell according to an embodiment.

FIG. 5 is a flowchart 500 for method of fabricating a memory cell according to an embodiment. Example implementations may include blocks in addition to those shown and described, fewer blocks, blocks occurring in an order different from FIG. 5, or any combination thereof. In an embodiment, DRAM memory cells may be produced in a manner that employs well-understood semiconductor manufacturing processes. For example, a method embodiment, as shown by block 510, may include fabricating at least the following: an array of memory cells in which at least one memory cell of the array comprises one or more layers of semiconductor devices in a semiconductor substrate. Of course, the array may also include multiple memory cells as follows: one or more layers of semiconductor devices in a semiconductor substrate may include a PMOS transistor device and an NMOS transistor device. The transistor devices (e.g., PMOS device and NMOS device) may be fabricated to be mutually adjacent so as to be in mutual electrical contact, such as drain and source regions, via electrically conductive contacts and via electrically conductive material in electrical contact with the electrically conductive contacts, as shown by block 520. In addition, the transistor devices are mutually adjacent so that electrically conductive material may be employed to and capable of selecting and activating the PMOS and NMOS transistor devices of the at least one (or more) memory cells via respective sufficient voltage signal levels for respective gate regions, such as described previously, for example. In a method embodiment, fabricating may further include forming one or more approximately cylindrical capacitors, as shown by block 530, such as above the at least one memory cell so as to be in mutual electrical contact with the at least one memory cell via the mutual electrical contact of the devices, for example, to form a storage node.

Thus, in at least one embodiment, for example, a two-dimensional array of NMOS and/or PMOS devices may be fabricated. After fabrication of a two-dimensional array of NMOS and/or PMOS devices, one or more approximately cylindrical capacitors may be formed in a layer disposed over device layer(s), for example. One or more approximately cylindrical capacitors, connected via an electrically conductive material to NMOS and/or PMOS devices so as to form a storage node may provide charge storage, for example, approximately in the range from approximately 10.0 to approximately 100.0 femtofarads of capacitance in an embodiment. Thus, in at least in some embodiments, refresh of stored charge may be performed at a frequency that may not be a significant burden to electronic circuitry associated with a DRAM array. However, embodiments may provide additional advantages, and claimed subject matter is not necessarily limited in scope to this or other advantages.

FIG. 1 is a schematic diagram depicting an example computing platform 100 including an array of memory devices according to an embodiment. In implementations, memory system 130 may comprise storage area 150, which may comprise one or more memory arrays, such as arrays of DRAM memory cells, in accordance with one or more example embodiments. Memory system 130 may, for example, in an embodiment be coupled (e.g., connected) to a processor 120 by way of a communication bus, such as communication bus 170.

In an implementation, memory system 130 may comprise a control unit 140, which may serve to generate VSLs that may be used to program and/or to refresh memory cells, such as DRAM memory cells, within storage area 150. Additionally, storage area 150 may store instructions 160 that may include one or more applications that may be executed by processor 120, for example. Processor 120 may transmit a memory access command to control unit 140 of memory system 130, for example. Control unit 140 may access one or more memory cells of storage area 150, at least in part, in response to receiving a memory access command from processor 120. Of course, computing platform 100 is merely one illustrative example of an implementation and the scope of claimed subject matter is not limited in these respects. As previously described, examples of implementations may include, a display, a tablet, a laptop, a desktop, a smart phone, a consumer electric device, such as a television, etc.

In an implementation, one or more DRAM arrays of storage area 150 may comprise DRAM memory cells using an NMOS and a PMOS semiconductor transistor switch to transfer charge to and/or from one or more charge storage devices, for example. In an example implementation, a logic value 1 (e.g., binary digital signal and/or state) may be stored by way of a transfer of electrical charge to a storage node, such as may be associated with one or more charge storage devices, such as one or more approximately cylindrical or parallel plate capacitors, for example, comprising a polysilicon conductive material. A logic value 0 (e.g., binary digital signal and/or state) may be stored by way of transfer of electrical charge from one or more charge storage devices, such as one or more approximately cylindrical or parallel plate capacitors, such as via a connection to a local ground, for example.

Figure 2:
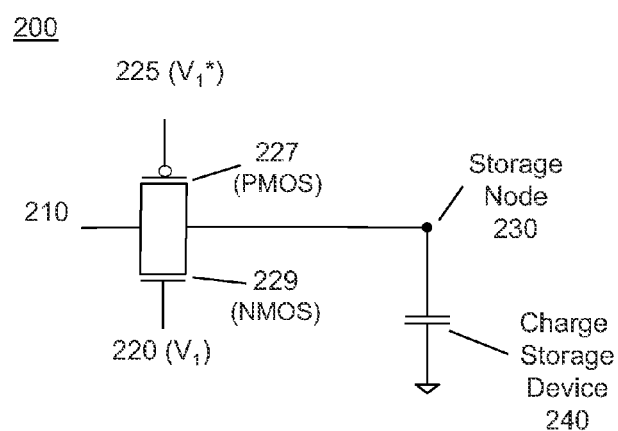
FIG. 2 is circuit diagram according to an embodiment.

FIG. 2 is circuit diagram 200 showing an NMOS transistor and a PMOS transistor according to an example embodiment. In FIG. 2, charge may be transferred to charge storage device 240, which may include a storage node, formed via a connection to the transistor devices. For example, a voltage signal level $V_1$ (e.g., 220) and a VSL comprising a complement of $V_1$ (e.g., $V_1^*$, designated by 225), for example, may have sufficient respective voltage signal levels to activate respective transistors 229 and 227. Thus, in an embodiment, $V_1$ may comprise a VSL of approximately 1.2 volts, for example, a complement of $V_1$ may comprise a VSL of approximately 0.0 volts. In an embodiment, for example, $V_1$ may represent, for example, a value that at least approximates a VSL of a bitline. Thus, as a result $V_1$, an approximation of a bitline VSL in this example, and its complement, $V_1^*$, in this example, may result in transfer of charge to charge storage device 240, such as via current flow, so as to generate a voltage signal level at storage node 230 of approximately the bitline VSL. It is noted, however, that a VSL of a bitline is not limited in scope to $V_1$. For example, a VSL approximately zero or approximately in the range from approximately zero to approximately $V_1$ may be employed in an embodiment.

For example, in the embodiment of FIG. 2, a VSL of approximately 0.0 volts at a gate terminal of PMOS transistor 227 and a VSL greater than a threshold voltage for NMOS transistor (e.g., a VSL approximately in the range of from approximately 0.5 to approximately 0.7 volts) at a gate terminal of NMOS transistor 229 may permit an approximate value of a VSL present at terminal 210 to generate transfer of charge via current flow to storage node 230. Accordingly, whether terminal 210 provides a VSL of approximately 0.0 volts or a VSL of approximately 1.2 volts, for example, or another value between these values, the VSL provided may be generated at least approximately at storage node 230.

Thus, in an embodiment, as described, a relatively low-resistance current path may be formed that gives rise to a small and/or approximately negligible voltage drop from terminal 210 to storage node 230. In a particular embodiment, such as that of FIG. 2 and as summarized in Table 1 (below), a relatively low resistance current path may be formed through, for example, at least one of PMOS transistor 227 and NMOS transistor 229, at least approximately as a function of a VSL present at terminal 210. In one possible example, if a VSL of approximately 1.2 volts is present at a gate terminal of NMOS transistor 229, a logic 0, represented by a VSL of approximately 0.0 volts at 210 may be generated by way of a transfer of charge via NMOS transistor 229 to storage node 230. Continuing with this example, if a VSL of approximately 0.0 volts signal is present at a gate terminal of PMOS transistor 227, a VSL of approximately 1.2 volts present at 210 may be generated by way of a transfer of charge via PMOS transistor 227 to storage node 230. If a voltage signal level (e.g., $V_1$, for example) at a gate terminal of 229 is replaced with a logical complementary voltage (e.g., V1*), and if a voltage signal level of a logical complementary voltage (e.g., $V_1$*) at a gate terminal of 227 is replaced with a logical complementary voltage (e.g., V1), a relatively high impedance current path to and/or from storage node 230 may result, thereby tending to reduce incidence of an appreciable amount of charge stored at charge storage device 240 quickly leaking from a storage node, such as through 210, for example. It should be noted that VSLs identified represent merely examples and claimed subject matter is not limited to illustrative examples. Rather, claimed subject matter is intended to embrace any and all possible VSLs, especially relatively low VSLs.

TABLE 1

| | | Example | |
|---|---|---|---|
| Terminal 210 | Gate | Current Path | Storage Node |
| 0.0 volt | 1.2 volt (e.g., $V_1$) | NMOS Transistor | ~0.0 volt |
| 1.2 volt | 0.0 volt (e.g., $V_1$*) | PMOS Transistor | ~1.2 volt |

Figure 3:
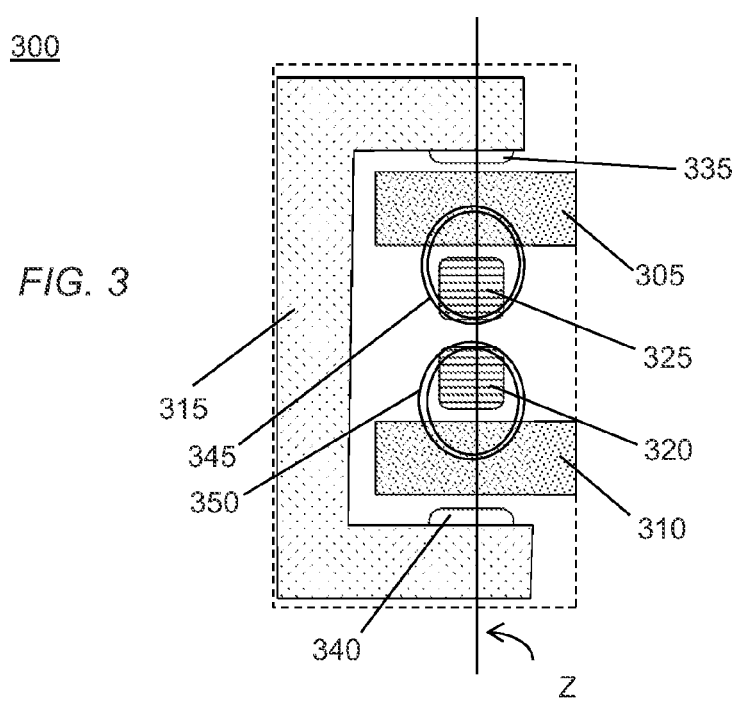
FIG. 3 is a top view of a device structure according to an embodiment.

FIG. 3 is a top view of a device structure for a memory cell according to an embodiment 300. A reference plane "Z" is shown bisecting features of FIG. 3, which will be further explained with reference to FIG. 4 herein. In an embodiment, a device structure of FIG. 3 may operate at a VSL of approximately 1.2 volts and be formed substantially in accordance with a fabrication process, such as a process using approximately a 90 nm line width technology with a wafer size of approximately 300.0 mm. In embodiments, a variety of steppers may be used for 90 a nm line width technology node, such as 193 nm as well as 248 nm wavelengths, for example. However, a device structure, such as 300 of FIG. 3, may be fabricated using other process technologies, such as 65 nm line width technology, 45 nm line width technology, and so forth, and claimed subject matter is not limited to a particular process, wafer sizes, laser, and/or related parameters.

In FIG. 3, electrically conductive trace 315 may be seen as mutually coupling and/or connecting PMOS contact 335 with NMOS contact 340. PMOS contact 335 and NMOS contact 340 are at least partially obscured by electrically conductive trace 315, which, at least in the embodiment of FIG. 3, may be deposited over (e.g., above or on) contacts 335 and 340. In embodiments, by coupling and/or connecting PMOS contacts and NMOS contacts to one another, thereby forming a bitline electrical connection, in a manner that accords with bitline 210 of FIG. 2, an electric current may flow between an external power source, such as a memory controller and/or other circuitry, for example, and a device structure, such as 300. Gate traces 305 and 310, also shown in FIG. 3, may be used with a device structure, for example, so that a voltage signal level sufficient to activate a transistor may be present. In example embodiments, one of gate traces 305 and 310 may be used, such as with a VSL of approximately 1.2 volts, for example a second of traces 305 and 310 may comprise a logical complement, such as a voltage signal level of approximately 0.0 volts, for example.

Approximately cylindrical capacitor 345, shown as transparent in FIG. 3, may be seen as positioned over (e.g., above or on) capacitor bonding pad 325. Likewise, approximately cylindrical capacitor 350, also shown as transparent in FIG. 3, may be seen as positioned over (e.g., above or on) capacitor bonding pad 320. In an embodiment, approximately cylindrical capacitors 345 and 350 may provide a capacitance of, for example, approximately in the range from approximately 10.0 to approximately 100.0 femtofarad. Although not explicitly shown in FIG. 3, in an embodiment, capacitor bonding pads 320 and 325 may be electrically connected to one another to form a common storage node, in a manner that accords with storage node 230 of FIG. 2, for example. In an embodiment, a device structure of FIG. 3 may consume, for example, a planar surface area of approximately 1.0 square micron.

Figure 4:
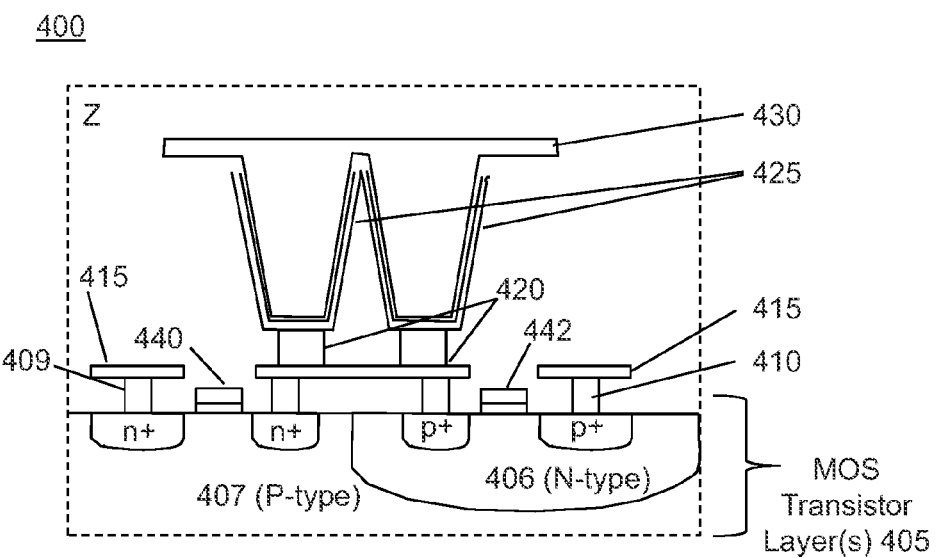
FIG. 4 is a side view of the device structure of FIG. 3.

FIG. 4 is a side view of device structure 300. The device structure of FIG. 4, therefore, corresponds to the structure of FIG. 3, cut along the Z plane of FIG. 3, although claimed subject matter is not limited to particular arrangements of components and/or structures. In device structure 300, MOS transistor layers 405 may represent NMOS and PMOS transistors comprising P-type semiconductor substrate 407 and N-type semiconductor substrate 406, fabricated by way of a semiconductor fabrication process, such as a 90 nm process, for example. Contact regions, such as shown by contacts 410, may be formed over (e.g., above or on) $n^+$ and $p^+$ wells and a metal layer 415 may be formed over (e.g., above or on) contact regions. Although not explicitly shown in FIG. 4, metal layer 415 may correspond to electrically conductive trace 315 of FIG. 3. Accordingly, metal layer 415 may electrically connect contact 410, which is deposited over N-type semiconductor substrate 406, with contact 409, which is deposited over P-type semiconductor substrate 407.

Storage node contacts 420 of FIG. 4 may include pads, such as 320 and 325, shown in FIG. 3, and may provide electrical connection between capacitors 425 and an $n^+$ well formed within P-type semiconductor substrate 407 and a $p^+$ well formed within N-type semiconductor substrate 406.

Thus, in the embodiment of FIG. 4, consistent with the circuit of FIG. 2, electric current may flow between capacitive plate 425 and a transistor of MOS transistor layer 405, for example. Current flow may be at least partially controlled and/or at least partially affected by a voltage signal level present at 440 and a complement of a VSL present at 442, for example. Contacts 440 and 442 may comprise transistor gates separated from an underlying P-type semiconductor substrate or an underlying N-type semiconductor substrate by a dielectric, such as an oxide layer, for example. In an embodiment, an oxide layer may be suitable for use with a relatively low voltage signal level, such as approximately in the range from approximately 1.0 volts to approximately 2.0 volts, for example.

Cell plate 430 and capacitive plate 425 may form an electric field in a manner that accords with a polysilicon approximately cylindrical capacitor structure comprising adjacent conductive surfaces separated by an insulating material, such as tantalum pentoxide ($Ta_2O_5$) or other dielectric material, to provide at least partial electrical isolation. It should be noted, however, that claimed subject matter is not limited to any particular geometric shape of a capacitive structure, nor should claimed subject matter be limited to use of particular dielectric materials. In some embodiments, for example, charge storage devices other than capacitors may be employed. Further, capacitive components may comprise a variety of shapes, which may include planar structures, for example, and claimed subject matter is not limited in these respects.

From FIG. 4, it may be seen that an approximately cylindrical capacitor, which may comprise a reasonable surface area and may be disposed over (e.g., above or on) a transistor layer(s). This may give rise to charge storage capability, such as in comparison with a planar capacitor, for example, in an embodiment, for use in a DRAM memory cell without consuming significant planar surface area, such as for layer(s) 405, for example. Accordingly, a DRAM cell of FIGS. 3 and 4 may retain charge, which may correspond to a logic value associated with a DRAM cell, without significantly more frequent refresh from a memory controller and/or additional memory circuitry. Additionally, performance may be achieved using relatively low voltage signal levels (e.g., approximately in the range from approximately 1.0 volts to approximately 2.0 volts) with fabrication processes which may, for example, reduce or eliminate a need for higher voltage oxide processes, such as a 3 volt oxide process, etc. Further, performance advantages may be achieved using relatively well-understood and/or mature fabrication processes, such as, for example, a 90 nm line width process. However, other processes, such as 65 nm line width processes, 45 nm line width processes, and so forth may be employed. Of course, claimed subject matter is not limited to example embodiments, such as those previously described, for example.

Figure 6:
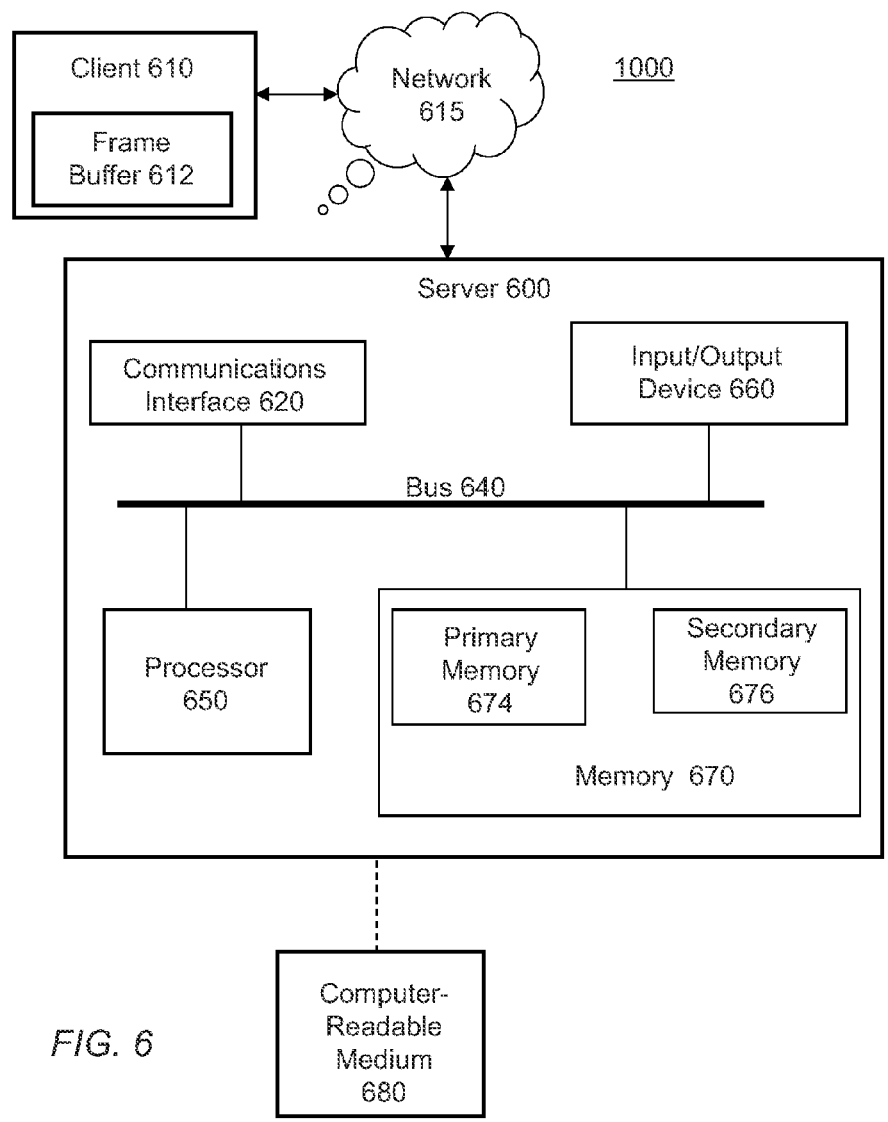
FIG. 6 is a schematic diagram of another computing platform including a memory cell according to an embodiment.

For purposes of illustration, FIG. 6 is an illustration of an embodiment of a computing platform or computing device that may be employed in a client-server type interaction, such as described infra. In FIG. 6, server 600 may interface with a client 610, which may comprise features of a conventional client device, for example. Communications interface 620, processor (e.g., processing unit) 650, and memory 670, which may comprise primary memory 674 and secondary memory 676, may communicate by way of communication bus 640, for example. In FIG. 6, client 610 may store various forms of content, such as analog, uncompressed digital, lossless compressed digital, or lossy compressed digital formats for content of various types, such as video, imaging, text, audio, etc.
in the form physical states or signals, for example. Client 610 may communicate with server 600 by way of an Internet connection via network 615, for example. Although the computing platform of FIG. 6 shows the above-identified components, claimed subject matter is not limited to computing platforms having only these components as other implementations may include alternative arrangements that may comprise additional components, fewer components, or components that function differently while achieving similar results. Rather, examples are provided merely as illustrations. It is not intended that claimed subject matter to limited in scope to illustrative examples.

Processor 650 may be representative of one or more circuits, such as digital circuits, to perform at least a portion of a computing procedure or process. By way of example but not limitation, processor 650 may comprise one or more processors, such as controllers, microprocessors, microcontrollers, application specific integrated circuits, digital signal processors, programmable logic devices, field programmable gate arrays, and the like, or any combination thereof. In implementations, processor 650 may perform signal processing to manipulate signals or states or to construct signals or states, for example.

Memory 670 may be representative of any storage mechanism. Memory 670 may comprise, for example, primary memory 674 and secondary memory 676, additional memory circuits, mechanisms, or combinations thereof may be used. Memory 670 may comprise, for example, random access memory (e.g., DRAM), read only memory, or one or more data storage devices or systems, such as, for example, a disk drive, an optical disc drive, a tape drive, a solid-state memory drive, just to name a few examples. Memory 670 may be utilized to store a program, as an example. Memory 670 may also comprise a memory controller for accessing computer readable-medium 680 that may carry and/or make accessible content, code, and/or instructions, for example, executable by processor 650 or some other controller or processor capable of executing instructions, for example.

Under the direction of processor 650, memory, such as cells storing physical states, representing for example, a program, may be executed by processor 650 and generated signals may be transmitted via the Internet, for example. Processor 450 may also receive digitally-encoded signals from server 600.

Network 615 may comprise one or more communication links, processes, and/or resources to support exchanging communication signals between a client and server, which may, for example, comprise one or more servers (not shown). By way of example, but not limitation, network 615 may comprise wireless and/or wired communication links, telephone or telecommunications systems, Wi-Fi networks, WiMAX networks, the Internet, the web, a local area network (LAN), a wide area network (WAN), or any combination thereof.

The term "computing platform," as used herein, refers to a system and/or a device, such as a computing device, that includes a capability to process and/or store data in the form of signals and/or states. Thus, a computing platform, in this context, may comprise hardware, software, firmware, or any combination thereof (other than software per se). Client 610, as depicted in FIG. 6, is merely one such example, and claimed subject matter is not limited to this particular example. For one or more embodiments, a computing platform may comprise any of a wide range of digital electronic devices, including, but not limited to, personal desktop or notebook computers, high-definition televisions, digital versatile disc (DVD) players and/or recorders, game consoles, satellite television receivers, cellular telephones, personal digital assistants, mobile audio and/or video playback and/or recording devices, or any combination of the above. Further, unless specifically stated otherwise, a process as described herein, with reference to flow diagrams and/or otherwise, may also be executed and/or affected, in whole or in part, by a computing platform.

In an embodiment, client 610 may comprise frame buffer 612 which may include, for example, one or more memory arrays, wherein at least some of the one or more memory arrays comprise a plurality of two-transistor DRAM memory cells. At least some of the two-transistor DRAM memory cells may comprise, for example, a corresponding plurality of charge storage devices positioned over and coupled to P-type MOS transistors and-type MOS transistors having a common electrical contact. The P-type and N-type transistors, respectively, may comprise a gate contact that accepts logically complementary voltage signal levels so that during operation of the frame buffer, an increase or decrease in charge stored by at least some of the plurality of charge storage devices occurs within an interval that is at least as long as a refresh interval of frame buffer 612. In embodiments, frame buffer 612 may be coupled to a display device and may refresh pixel elements (pixels) of the display device at a rate of approximately 60 refresh operations per second (e.g., approximately 16.7 ms).

Memory 670 may store cookies relating to one or more users and may also comprise a computer-readable medium that may carry and/or make accessible content, code and/or instructions, for example, executable by processor 650 or some other controller or processor capable of executing instructions, for example. A user may make use of an input device, such as a computer mouse, stylus, track ball, keyboard, or any other device capable of receiving an input from a user.

Regarding aspects related to a communications or computing network, a wireless network may couple client devices with a network. A wireless network may employ stand-alone ad-hoc networks, mesh networks, Wireless LAN (WLAN) networks, cellular networks, or the like. A wireless network may further include a system of terminals, gateways, routers, or the like coupled by wireless radio links, and/or the like, which may move freely, randomly or organize themselves arbitrarily, such that network topology may change, at times even rapidly. Wireless network may further employ a plurality of network access technologies, including Long Term Evolution (LTE), WLAN, Wireless Router (WR) mesh, or 2nd, 3rd, or 4th generation (2G, 3G, or 4G) cellular technology, or other technologies, or the like. Network access technologies may enable wide area coverage for devices, such as client devices with varying degrees of mobility, for example.

A network may enable radio frequency or wireless type communications via a network access technology, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), Bluetooth, 802.11b/g/n, or other, or the like. A wireless network may include virtually any type of now known, or to be developed, wireless communication mechanism by which signals may be communicated between devices, such as a client device or a computing device, between or within a network, or the like.

Communications between a computing device and a wireless network may be in accordance with known, or to be developed cellular telephone communication network protocols including, for example, global system for mobile communications (GSM), enhanced data rate for GSM evolution (EDGE), and worldwide interoperability for microwave access (WiMAX). A computing device may also have a subscriber identity module (SIM) card, which, for example, may comprise a detachable smart card that stores subscription information of a user, and may also store a contact list of the user. A user may own the computing device or may otherwise be its primary user, for example. A computing device may be assigned an address by a wireless or wired telephony network operator, or an Internet Service Provider (ISP). For example, an address may comprise a domestic or international telephone number, an Internet Protocol (IP) address, and/or one or more other identifiers. In other embodiments, a communication network may be embodied as a wired network, wireless network, or combination thereof.

A computing device may vary in terms of capabilities or features. Claimed subject matter is intended to cover a wide range of potential variations. For example, a network device may include a numeric keypad or other display of limited functionality, such as a monochrome liquid crystal display (LCD) for displaying text. In contrast, however, as another example, a web-enabled computing device may include a physical or a virtual keyboard, mass storage, one or more accelerometers, one or more gyroscopes, global positioning system (GPS) or other location-identifying type capability, and/or a display with a higher degree of functionality, such as a touch-sensitive color 2D or 3D display, for example.

A computing device may include or may execute a variety of now known, or to be developed operating systems, or derivatives and/or versions, including personal computer operating systems, such as a Windows, iOS or Linux, or a mobile operating system, such as iOS, Android, or Windows Mobile, or the like. A computing device may include or may execute a variety of possible applications, such as a client software application enabling communication with other devices, such as communicating one or more messages, such as via email, short message service (SMS), or multimedia message service (MMS), including via a network, such as a social network including, but not limited to, Facebook, LinkedIn, Twitter, Flickr, or Google+, to provide only a few examples. A computing device may also include or execute a software application to communicate content, such as, for example, textual content, multimedia content, or the like. A computing device may also include or execute a software application to perform a variety of possible tasks, such as browsing, searching, playing various forms of content, including locally stored or streamed video, or games such as, but not limited to, fantasy sports leagues. The foregoing is provided merely to illustrate that claimed subject matter is intended to include a wide range of possible features or capabilities.

A network including a computing device, for example, may also be extended to another device communicating as part of another network, such as via a virtual private network (VPN). To support a VPN, transmissions may be forwarded to the VPN device. For example, a software tunnel may be created. Tunneled traffic may, or may not be encrypted, and a tunneling protocol may be substantially complaint with or substantially compatible with any past, present or future versions of any of the following protocols: IPSec, Transport Layer Security, Datagram Transport Layer Security, Microsoft Point-to-Point Encryption, Microsoft's Secure Socket Tunneling Protocol, Multipath Virtual Private Network, Secure Shell VPN, or another existing protocol, or another protocol that may be developed.

A network may be compatible with now known, or to be developed, past, present, or future versions of any, but not limited to the following network protocol stacks: ARCNET, AppleTalk, ATM, Bluetooth, DECnet, Ethernet, FDDI, Frame Relay, HIPPI, IEEE 1394, IEEE 802.11, IEEE-488, Internet Protocol Suite, IPX, Myrinet, OSI Protocol Suite, QsNet, RS-232, SPX, System Network Architecture, Token Ring, USB, or X.25. A network may employ, for example, TCP/IP, UDP, DECnet, NetBEUI, IPX, Appletalk, other, or the like. Versions of the Internet Protocol (IP) may include IPv4, IPv6, other, and/or the like.

It will, of course, be understood that, although particular embodiments will be described, claimed subject matter is not limited in scope to a particular embodiment or implementation. For example, one embodiment may be in hardware, such as implemented to operate on a device or combination of devices, for example, whereas another embodiment may be in software. Likewise, an embodiment may be implemented in firmware, or as any combination of hardware, software, and/or firmware, for example (other than software per se). Likewise, although claimed subject matter is not limited in scope in this respect, one embodiment may comprise one or more articles, such as a storage medium or storage media. Storage media, such as, one or more CD-ROMs and/or disks, for example, may have stored thereon instructions, executable by a system, such as a computer system, computing platform, or other system, for example, that may result in an embodiment of a method in accordance with claimed subject matter being executed, such as a previously described embodiment, for example; although, of course, claimed subject matter is not limited to previously described embodiments. As one potential example, a computing platform may include one or more processing units or processors, one or more devices capable of inputting/outputting, such as a display device, input/output device 660 a keyboard and/or a mouse, and/or one or more memories, such as static random access memory, dynamic random access memory, flash memory, and/or a hard drive.

In the preceding detailed description, numerous specific details have been set forth to provide a thorough understanding of claimed subject matter. However, it will be understood by those skilled in the art that claimed subject matter may be practiced without these specific details. In other instances, methods and/or apparatuses that would be known by one of ordinary skill have not been described in detail so as not to obscure claimed subject matter. Some portions of the preceding detailed description have been presented in terms of logic, algorithms, and/or symbolic representations of operations on binary signals or states, such as stored within a memory of a specific apparatus or special purpose computing device or platform. In the context of this particular specification, the term specific apparatus or the like includes a general purpose computing device, such as general purpose computer, once it is programmed to perform particular functions pursuant to instructions from program software.

Algorithmic descriptions and/or symbolic representations are examples of techniques used by those of ordinary skill in the signal processing and/or related arts to convey the substance of their work to others skilled in the art. An algorithm is here, and generally, is considered to be a self-consistent sequence of operations and/or similar signal processing leading to a desired result. In this context, operations and/or processing involves physical manipulation of physical quantities. Typically, although not necessarily, such quantities may take the form of electrical and/or magnetic signals and/or states capable of being stored, transferred, combined, compared, processed or otherwise manipulated as electronic signals and/or states representing information. It has proven convenient at times, principally for reasons of common usage, to refer to such signals and/or states as bits, data, values, elements, symbols, characters, terms, numbers, numerals, information, and/or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing device. In the context of this specification, therefore, a special purpose computer and/or a similar special purpose computing device is capable of processing, manipulating and/or transforming signals and/or states, typically represented as physical electronic and/or magnetic quantities within memories, registers, and/or other information storage devices, transmission devices, and/or display devices of the special purpose computer and/or similar special purpose computing device. In the context of this particular patent application, as mentioned, the term "specific apparatus" may include a general purpose computing device, such as a general purpose computer, once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change or transformation in molecular structure, such as from crystalline to amorphous or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state form a binary one to a binary zero or vice-versa in a memory device may comprise a transformation, such as a physical transformation. Rather, the foregoing is intended as illustrative examples.

While there has been illustrated and/or described what are presently considered to be example features, it will be understood by those skilled in the relevant art that various other modifications may be made and/or equivalents may be substituted, without departing from claimed subject matter. Additionally, many modifications may be made to adapt a particular situation to the teachings of claimed subject matter without departing from one or more concepts described herein. Therefore, it is intended that claimed subject matter not be limited to the particular examples disclosed, but that such claimed subject matter may also include all aspects falling within appended claims and/or equivalents thereof.

What is claimed is:

1. A memory array comprising: at least a two-transistor DRAM memory cell, said memory cell comprising a charge storage device positioned over and coupled to a P-type MOS transistor and an N-type MOS transistor having a common electrical contact, said P-type and said N-type transistors respectively having a gate contact to accept logically complementary voltage signal levels so that during operation of said memory cell an increase or a decrease in charge stored by said charge storage device takes place.

2. The memory cell of claim 1, wherein said charge storage device comprises one or more capacitors coupled to a respective drain contact of said transistors.

3. The memory cell of claim 2, wherein said one or more capacitors comprise one or more approximately cylindrical capacitors.

4. The memory cell of claim 1, wherein the respective gate contacts to accept a VSL approximately in the range from approximately 0.0 volts to approximately 1.8 volts so that during operation of said memory cell an increase or a decrease in charge stored by said charge storage device takes place.

5. The memory cell of claim 1, wherein said memory cell comprises a dielectric layer under the respective gate contacts of sufficient thickness so that a VSL approximately in the range of from approximately 0.0 volts to approximately 1.8 volts is capable of activating at least one of said transistors.

6. A method comprising:
fabricating at least the following: an array of memory cells in which at least one memory cell of the array comprises:
one or more layers of semiconductor devices in a semiconductor substrate, wherein the one or more layers includes a PMOS transistor device and an NMOS transistor device, said transistor devices mutually adjacent so as to be in mutual electrical contact via electrically conductive contacts at respective drain and source regions of said devices and mutually adjacent so as to be capable of being selected and activated via respective sufficient voltage signal levels at respective gate regions; wherein said fabricating includes forming one or more
capacitors above said at least one memory cell so as to be in mutual electrical contact with said at least one memory cell via said mutual electrical contact of said devices to said drain regions to form a storage node.

7. The method of claim 6, wherein said semiconductor substrate comprises silicon.

8. The method of claim 6, wherein at least some of said electrically conductive contacts comprise at least one of polysilicon or metal.

9. The method of claim 6, wherein said electrically conductive contacts so as to be capable of selecting and activating said PMOS and NMOS transistor devices comprise at least one of a bitline or a wordline.

10. The method of claim 6, wherein said one or more capacitors comprises one or more approximately cylindrical capacitors.

11. A frame buffer comprising:
one or more memory arrays, at least some of said one or more memory arrays comprising:
a plurality of two-transistor DRAM memory cells, said plurality of two-transistor DRAM memory cells having a corresponding plurality of charge storage devices positioned over and coupled to a P-type MOS transistor and an N-type MOS transistor having a common electrical contact, said P-type and said N-type transistors respectively having a gate contact to accept logically complementary voltage signal levels so that during operation of said frame buffer, an increase or a decrease in charge stored by at least some of said corresponding plurality of charge storage devices occurs within an interval at least as long as a refresh interval of said frame buffer.

12. The memory cell of claim 11, wherein at least some of said corresponding plurality of charge storage devices comprise one or more capacitors coupled to a respective drain contact of one or more of said plurality of two-transistor DRAM memory cells.

13. The memory cell of claim 12, wherein said one or more capacitors stores said increased or said decreased charge for at least approximately 16.7 ms.

\* \* \* \* \*